(12) United States Patent
Miyamoto

(10) Patent No.: US 9,601,298 B2
(45) Date of Patent: Mar. 21, 2017

(54) ELECTRON GUN SUPPORTING MEMBER AND ELECTRON GUN APPARATUS

(71) Applicant: NuFlare Technology, Inc., Yokohama (JP)

(72) Inventor: Nobuo Miyamoto, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/833,447

(22) Filed: Aug. 24, 2015

(65) Prior Publication Data
US 2016/0064174 A1 Mar. 3, 2016

(30) Foreign Application Priority Data

Sep. 3, 2014 (JP) ................. 2014-179657

(51) Int. Cl.
*H01J 29/02* (2006.01)
*H01J 29/48* (2006.01)
*H01J 3/02* (2006.01)
*H01J 3/38* (2006.01)
*H01J 29/92* (2006.01)
(Continued)

(52) U.S. Cl.
CPC ............ *H01J 29/025* (2013.01); *H01J 3/027* (2013.01); *H01J 3/38* (2013.01); *H01J 29/02* (2013.01); *H01J 29/485* (2013.01); *H01J 29/92* (2013.01); *H01J 29/96* (2013.01); *H01J 37/065* (2013.01); *H01J 2237/032* (2013.01); *H01J 2237/038* (2013.01); *H01J 2237/061* (2013.01); *H01J 2237/31776* (2013.01)

(58) Field of Classification Search
CPC .......... H01J 29/02; H01J 29/025; H01J 29/04; H01J 29/48; H01J 37/065; H01J 37/06; H01J 37/073
See application file for complete search history.

(56) References Cited

U.S. PATENT DOCUMENTS

| 6,495,952 B1* | 12/2002 | Nakamura | H01J 3/027 |
| | | | 313/417 |
| 2014/0055025 A1* | 2/2014 | Yasuda | H01J 1/148 |
| | | | 313/456 |
| 2014/0231668 A1* | 8/2014 | Yasuda | B82Y 40/00 |
| | | | 250/396 R |

FOREIGN PATENT DOCUMENTS

JP 2002-313269 10/2002

OTHER PUBLICATIONS

Namio Matuda et al. "Measurements of Secondary Electron Emission and Cathodoluminescence for Alumina Microwave Windows", National Laboratory for High Energy Physics, Dept. of Applied Physics, University of Tokyo, 1987, 4 pages.

(Continued)

*Primary Examiner* — Thai Pham
(74) *Attorney, Agent, or Firm* — Oblon, McClelland, Maier & Neustadt, L.L.P.

(57) ABSTRACT

An electron gun supporting member includes an insulating supporting member configured such that its one end is connected to a predetermined member having a ground potential and other end is connected to a high-voltage electrode to which a high potential being a negative high potential for emitting electrons from an electron source is applied, so as to support the high-voltage electrode, and a metal film formed in a partial region, which contacts neither the high-voltage electrode nor the predetermined member, on the outer surface of the insulating supporting member.

13 Claims, 7 Drawing Sheets

(51) Int. Cl.
*H01J 29/96* (2006.01)
*H01J 37/065* (2006.01)

(56) References Cited

OTHER PUBLICATIONS

Ryoji Nagai et al. "High-Voltage testing of a 500-kV dc photocathode electron gun", Review of Scientific Instruments, 81, 033304, 2010, 5 pages.

* cited by examiner

ELECTRON GUN SUPPORTING MEMBER AND ELECTRON GUN APPARATUS

CROSS-REFERENCE TO RELATED APPLICATION

This application is based upon and claims the benefit of priority from the prior Japanese Patent Application No. 2014-179657 filed on Sep. 3, 2014 in Japan, the entire contents of which are incorporated herein by reference.

BACKGROUND OF THE INVENTION

Field of the Invention

Embodiments of the present invention relate generally to an electron gun supporting member and an electron gun apparatus, and more specifically, to an electron gun apparatus used as a beam source for a charged particle beam writing apparatus, for example.

Description of Related Art

An electron gun being a beam source is used in an electron beam apparatus, such as an electron beam writing or "drawing" apparatus and an electron microscope. In terms of electron beam writing, for example, it has excellent intrinsic resolution, and is used for producing a highly accurate master pattern.

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. The electron beam writing apparatus is used in production of such a high-accuracy master pattern.

FIG. 9 is a conceptual diagram explaining operations of a variable shaped electron beam writing or "drawing" apparatus. The variable shaped electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

Electron beams used for the electron beam writing apparatus are accelerated by a high voltage of several 10 kV, for example. In the electron gun apparatus, the electrode of such a high voltage is supported by a supporting member. However, there is a problem in that a creeping discharge may occur on the surface of the supporting member. If a creeping discharge occurs, the acceleration voltage of an electron beam is changed, which causes beam current fluctuation. Consequently, the writing accuracy of patterns to be written is degraded. Although conditioning is conventionally performed for a sufficient time period at the OFF line to improve the breakdown voltage when an electron gun is fabricated, the breakdown voltage characteristic is decreased due to subsequent use. Besides, there is disclosed a technique in which a groove is formed in a high voltage insulating glass in relation to discharge suppression of an electron gun (e.g., refer to Japanese Patent Application Laid-open (JP-A) No. 2002-313269).

BRIEF SUMMARY OF THE INVENTION

According to one aspect of the present invention, an electron gun supporting member includes an insulating supporting member configured such that its one end is connected to a predetermined member having a ground potential and other end is connected to a high-voltage electrode to which a high potential being a negative high potential for emitting electrons from an electron source is applied, so as to support the high-voltage electrode, and a metal film formed in a partial region, which contacts neither the high-voltage electrode nor the predetermined member, on an outer surface of the insulating supporting member.

According to another aspect of the present invention, an electron gun apparatus includes a cathode configured to be applied with an acceleration voltage and emit electrons, a Wehnelt electrode configured to be applied with a potential more negative than a negative potential of the acceleration voltage, an insulating supporting member configured such that its one end is connected to a predetermined member having a ground potential and other end is connected to the Wehnelt electrode so as to support the Wehnelt electrode, and a metal film formed in a partial region, which contacts neither the Wehnelt electrode nor the predetermined member, on an outer surface of the insulating supporting member.

Moreover, according to another aspect of the present invention, an electron gun supporting member includes an insulating supporting member configured such that its one end is connected to a predetermined member having a ground potential and other end supports a line connected to a high-voltage electrode to which a negative high potential for emitting electrons from an electron source is applied, and a metal film formed in a partial region, which contacts neither the line nor the predetermined member, on an outer surface of the insulating supporting member.

DETAILED DESCRIPTION OF THE INVENTION

The following embodiments are described in relation to an electron gun supporting member and an electron gun apparatus that can suppress a creeping discharge generated on the supporting member of a high-voltage electrode.

First Embodiment

Figure 1:
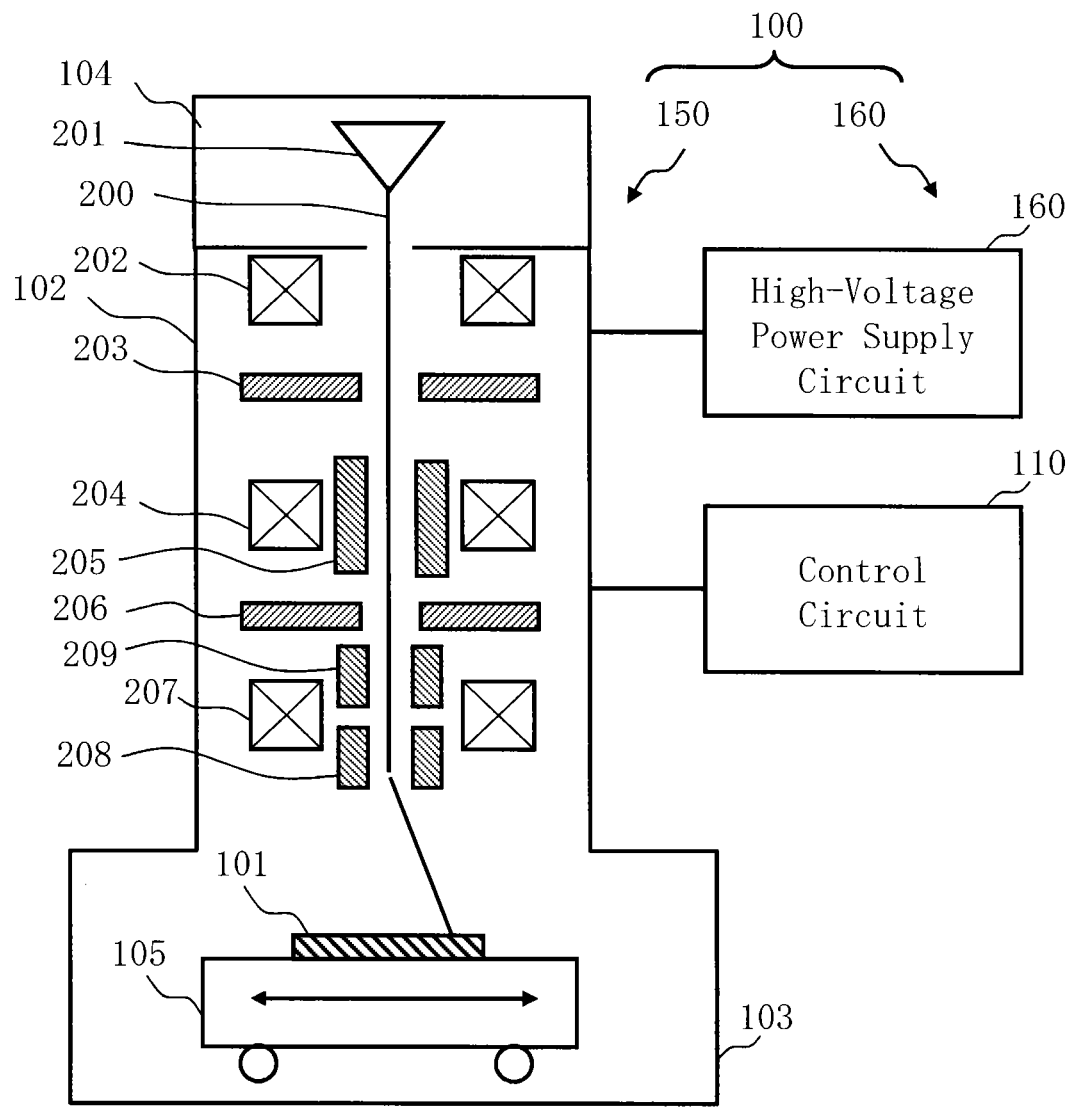
FIG. 1 is a schematic diagram showing a configuration of a writing apparatus according to a first embodiment.

FIG. 1 is a schematic diagram showing a configuration of a writing or "drawing" apparatus according to the first embodiment. An electron beam writing apparatus is here shown as an example of an electron beam apparatus. As shown in FIG. 1, a writing apparatus 100 includes a writing unit 150 and a control unit 160. The writing apparatus 100 is an example of the electron beam writing apparatus, and especially, an example of a variable shaped beam (VSB) writing apparatus. The writing unit 150 includes an electron gun apparatus, an electron optical column 102, and a writing chamber 103. The electron gun apparatus 104 is arranged on the electron optical column 102. The electron optical column 102 is arranged on the writing chamber 103. An electron gun 201 is arranged in the electron gun apparatus 104. In the electron optical column 102, there are arranged an illumination lens 202, a first aperture plate 203, a projection lens 204, a deflector 205, a second aperture plate 206, an objective lens 207, a main deflector 208, and a sub deflector 209. In the writing chamber 103, an XY stage 105 is arranged. On the XY stage 105, a target object or "sample" 101 such as a mask serving as a writing target is placed when performing writing. For example, the target object 101 is an exposure mask used for manufacturing semiconductor devices. The target object 101 may be, for example, a mask blank on which resist has been applied and nothing has yet been written.

The control unit 160 includes a high-voltage power supply circuit 120 and a control circuit 110. The high-voltage power supply circuit 120 is controlled by the control circuit 110, and applies a high voltage to the electron gun 201.

The electron beam 200 emitted from the electron gun 201 (emission unit) in the electron gun apparatus 104 irradiates the entire first aperture plate 203 having a quadrangular opening by the illumination lens 202. At this point, the electron beam 200 is shaped to be a quadrangle. Then, after passing through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After passing through the second aperture plate 206, the electron beam 200 of a second aperture image is focused by the objective lens 207 and deflected by the main deflector 208 and the sub deflector 209 so as to reach a desired position on the target object 101 placed on the XY stage 105 which moves continuously. FIG. 1 shows the case of using multiple stage deflection of two stages of the main and sub deflectors for position deflection. In such a case, the electron beam 200 of a shot concerned should be deflected to a reference position in a subfield (SF), which is obtained by further virtually dividing the stripe region, by the main deflector 208 while following the movement of the stage, and the beam of a shot concerned should be deflected to each irradiation position in the SF by the sub deflector 209.

Figure 2:
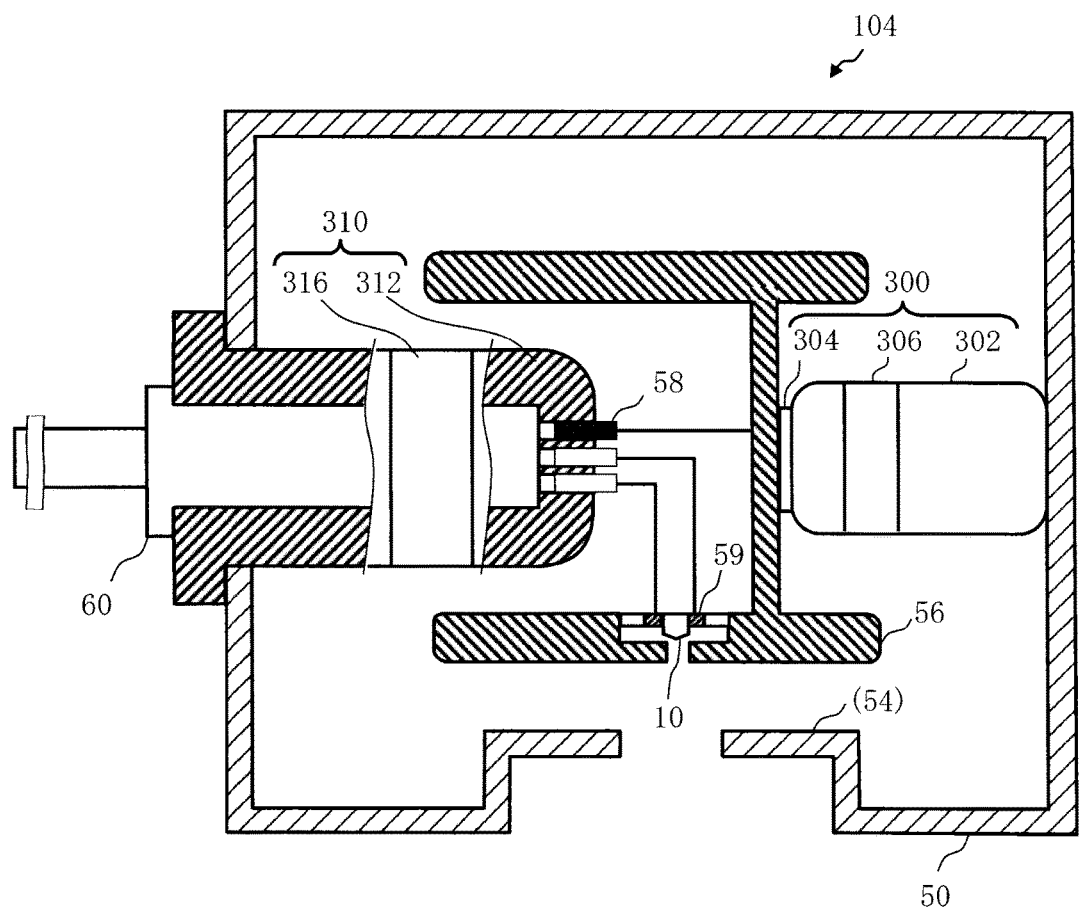
FIG. 2 shows an example of the internal structure of an electron gun apparatus according to the first embodiment.

FIG. 2 shows an example of the internal structure of an electron gun apparatus according to the first embodiment. As shown in FIG. 2, the electron gun apparatus 104 includes a cathode 10, a Wehnelt electrode 56 (high-voltage electrode), a heater 59, supporting members 300 and 310, and a housing 50. The housing 50 is made of a conductive material, and is earthed (grounded), and its electric potential is kept to be a ground potential. Moreover, the housing 50 functions as a vacuum case. The Wehnelt electrode 56 is supported by the supporting member 300 in the housing 50. The supporting member 300 (insulating supporting member), whose one end is connected to the housing 50 (predetermined member) having a ground potential and other end is connected to the Wehnelt electrode 56 (high-voltage electrode) to which a negative high voltage for emitting electrons from the cathode 10 used as an electron source is applied, supports the Wehnelt electrode 56. As the cathode 10, it is preferable to use single crystal lanthanum hexaboride (LaB$_6$) and the like, for example. As for the supporting member 300, one end is fixed, for example, to the internal wall surface of the housing 50, and the other end is connected to the wall surface of the Wehnelt electrode 56. As for the supporting member 310, after it is inserted into the housing 50 from the outside, its flange portion at one end is fixed to the outer wall surface of the housing 50, and, to the other end, a line which is connected to the Wehnelt electrode 56 and applied with a high voltage is brazed (fixed) with a stationary member 58. A connector 60 to be inserted is arranged inside the supporting member 310, and the line in the connector 60 is to be connected to the cathode 10 as will be described later. Moreover, in the housing 50, a circumference of a portion at the opposite side of the electron emission surface of the cathode 10 is covered by a cathode holder which functions as the heater 59. The heater 59 is supported by the Wehnelt electrode 56. Thereby, the cathode 10 is supported, with its electron emission surface down, by the Wehnelt electrode 56. Moreover, as for the housing 50, a flange portion having an opening therein through which an electron can pass is formed in the center of the electron emission surface side (lower side of FIG. 2), and this flange portion functions as an anode electrode 54. In the Wehnelt electrode 56, there is formed an opening through which an electron emitted from the electron emission surface of cathode 10 passes to the side of the anode electrode 54. The electron gun 201 includes the cathode 10, the Wehnelt electrode 56, and the anode electrode 54.

Figure 3:
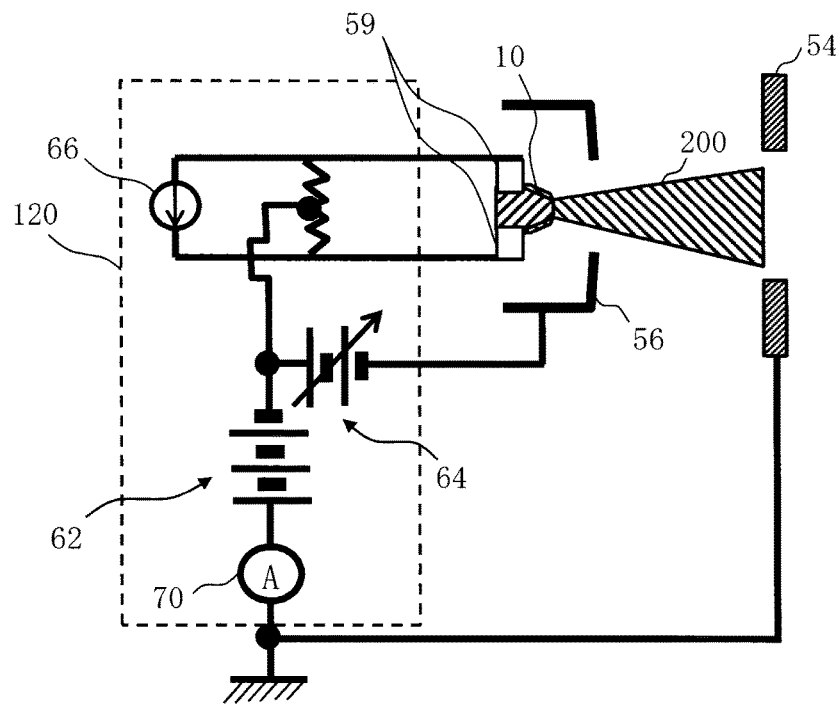
FIG. 3 shows an example of the circuit structure of an electron gun apparatus and a high-voltage power supply circuit according to the first embodiment.

FIG. 3 shows an example of the circuit structure of an electron gun apparatus and a high-voltage power supply circuit according to the first embodiment. In the high-voltage power supply circuit 120, there are arranged an acceleration voltage power source 62, a Wehnelt power source 64, and a heater power source 66. The pole on the cathode (−) side of the acceleration voltage power 62 is connected, in the housing 50, to the cathode 10 through the heater 59. The pole on the anode (+) side of the acceleration voltage power 62 is connected to the anode electrode 54 in the housing 50 and is grounded. Moreover, an ammeter 70 is connected in series between the pole on the anode (+) side of the acceleration voltage power source 62 and the anode electrode 54. Furthermore, the pole on the cathode (−) side of the acceleration voltage power source 62 is branched to be connected to the pole on the anode (+) side of the Wehnelt power source 64, and the pole on the cathode (−) side of the Wehnelt power source 64 is connected to the Wehnelt electrode 56 arranged between the cathode 10 and the anode electrode 54. The heater power source 66 is connected to the heater 59. At the time of electron beam emission, after the inside of the housing 50 is maintained to be in a vacuum state of a predetermined pressure by a vacuum pump (not shown), if the cathode 10 is heated by the heater 59 in a state where a fixed negative Wehnelt voltage (bias voltage) is applied to the Wehnelt electrode 56 from the Wehnelt power source 64 and a fixed negative acceleration voltage is applied to the cathode 10 from the acceleration voltage power source 62, electrons (electron group) are emitted from the cathode 10, and the emitted electrons (electron group) become an electron beam, by being accelerated by acceleration voltage, to advance toward the anode electrode 54. By this, a high electric potential to which a negative potential bias voltage has been further added in addition to a negative acceleration voltage, such as a 50 kV negative potential is applied to the Wehnelt electrode 56. In other words, a potential more negative than the negative potential of the acceleration voltage is applied to the Wehnelt electrode 56. By using such electron beams, a pattern is written on the target object 101 in the writing apparatus 100.

Figure 4:
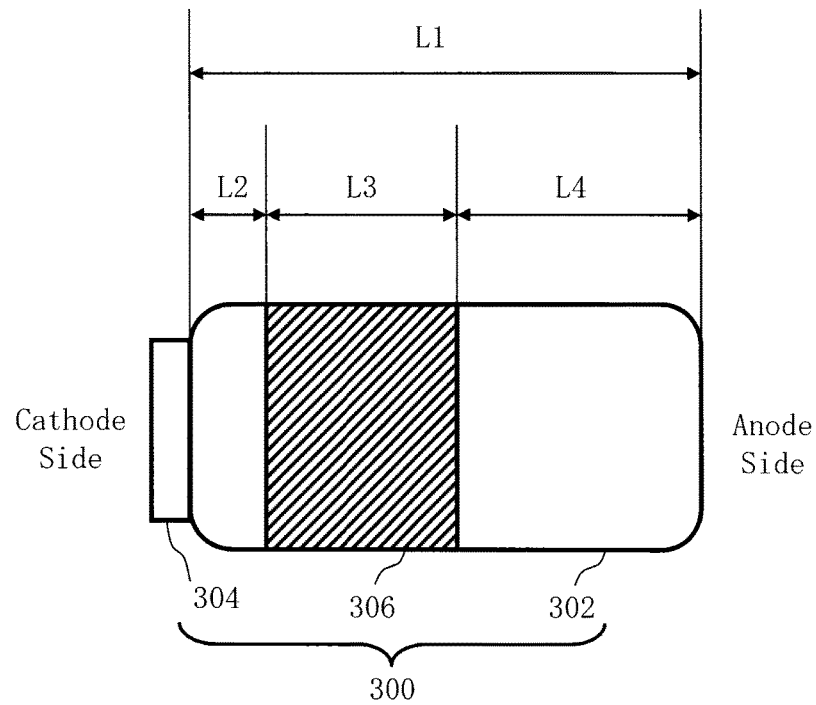
FIG. 4 shows the structure of a supporting member according to the first embodiment.

FIG. 4 shows the structure of a supporting member according to the first embodiment. The supporting member 300 is shown as an example in FIG. 4. An attachment metal fitting 304 is arranged at one end of a main body 302 of the supporting member 300. The main body 302 (insulating supporting member) is formed, for example, to be a solid cylindrical shape by using insulating material. For example, it is preferable to use alumina (Al$_2$O$_3$) (glass material). The attachment metal fitting 304 may be made of a conductive material (metal). When supporting the Wehnelt electrode 56, one end of the main body 302 is connected to the Wehnelt electrode 56 through the attachment metal fitting 304, and the other end of the main body 302 is connected to the internal wall of the housing 50. A metal film 306 is formed in a partial region, which contacts neither the Wehnelt electrode 56 (high-voltage electrode) nor the housing 50 (predetermined member), on the outer circumferential surface (curved surface) of the main body 302 (insulating supporting member). The metal film 306 is arranged in an electric-potentially floating state. In the case of FIG. 4, L1 is the length of the main body 302, L2 is the distance from the end of the main body 302 at the Wehnelt electrode 56 connection side (cathode side) to the position from which the metal film 306 is formed, and L3 is the width (length) of the outer surface region where the metal film 306 is formed. That is, the width (length) L2 from the end of the main body 302 at the Wehnelt electrode 56 connection side (cathode side) is an insulation distance (creeping distance) where no metal film 306 is formed. Moreover, a width (length) L4 from the end of the main body 302 at the housing 50 connection side (anode side: ground side) is also an insulation distance (creeping distance) where no metal film 306 is formed. The metal film 306 is made from a material whose secondary electron emission coefficient is less than that of the main body 302 (insulating supporting member). For example, a titanium compound or a molybdenum compound is used. Specifically, titanium nitride (TiN), molybdenum carbide (Mo$_2$C), or the like is preferably used.

When a negative high potential is applied to the Wehnelt electrode 56, it leads to that a negative high potential is also applied to the Wehnelt electrode 56 connection side (cathode side) of main body 302. Then, for a voltage V between this high potential and the ground potential, it becomes necessary to suppress a creeping discharge. Thus, the metal film 306 is formed such that the resistance in the region without the metal film 306, that is the regions each having a length L2 or L4, in the outer surface region of the main body 302 is a resistance R through which a current I that may flow by the high voltage V between the high electric potential applied to the Wehnelt electrode 56 and the ground potential becomes lower than or equal to an allowable dark current I'. The resistance R of the main body 302 can be defined by the following equation (1) using lengths L2 and L4 of the regions where no metal film 306 is formed, a cross-sectional area S, and a resistivity ρ of the material of the main body 302.

$$R=\rho(L2+L4)/S \qquad (1)$$

Then, the current I that may flow in the main body 302 by the high voltage V can be defined by the following equation (2).

$$I=V \cdot S/\{\rho(L2+L4)\} \qquad (2)$$

Therefore, in order for the current I to be less than or equal to the allowable dark current I', the region length (L2+L4) needs to satisfy the following equation (3).

$$(L2+L4)>I' \cdot \rho/(V \cdot S) \qquad (3)$$

Accordingly, the width (length) L3 of the region where the metal film 306 cam be obtained by the following equation (4).

$$L3=L1-(L2+L4) \qquad (4)$$

The values of L2 and L4 should satisfy the equation (3), and it is preferable for the border between L2 and L3 and the border between L4 and L3 to be away, in units of mm, from the edges. In other words, it is preferable for each of them to be set to be longer than or equal to several mm. For example, values are set to satisfy the equation (3) and to be greater than or equal to 5 mm respectively. Moreover, the value of L3 is preferably set to be a value satisfying the equation (4) and as large as possible. Thereby, emission of a secondary electron can be further suppressed as described later.

The supporting member 310 is connected to the line which is connected to the Wehnelt electrode 56 through the stationary member 58 at one end of the main body 312, and supports the line. Therefore, the high voltage for Wehnelt electrode 56 to be applied to the line will also be applied to the one end side of the main body 312. The flange portion at the other end of the main body 312 is connected to the outer wall surface of the housing 50. A metal film 316 is formed in a partial region, which contacts neither the line (or stationary member 58) to the Wehnelt electrode 56 (high-voltage electrode) nor the housing 50 (predetermined member), on the outer circumferential surface (curved surface) of the main body 302 (insulating supporting member). The use material of the metal film 316 may be the same as that of the metal film 306. The arrangement positional relation of the metal film 316 can be obtained by the same calculation method as that for the metal film 306.

Figure 5A:
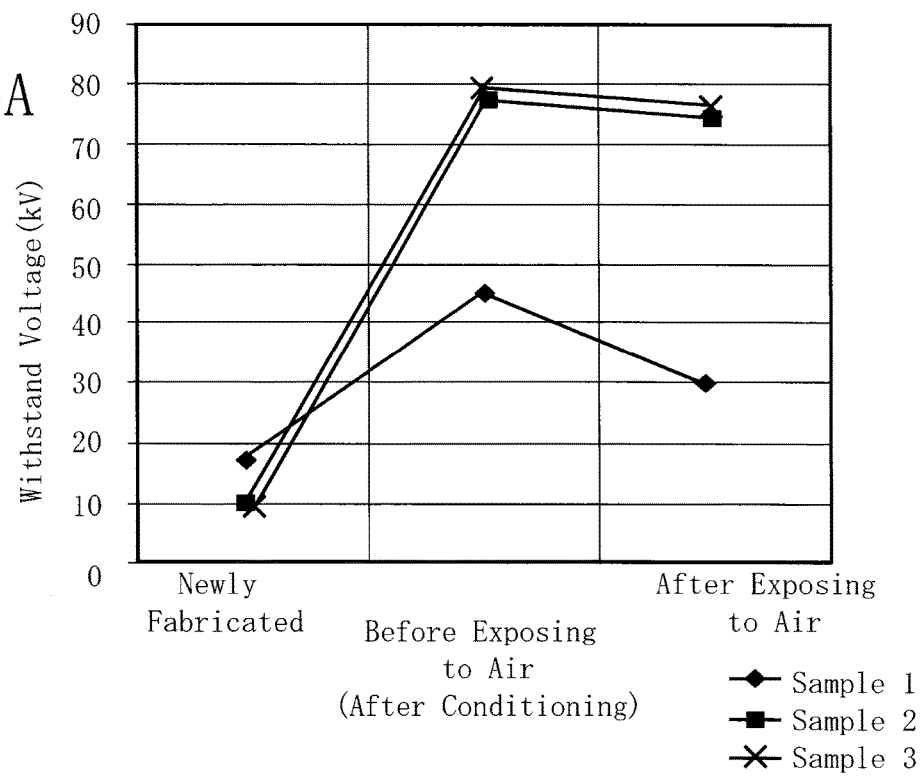
FIGS. 5A to 5C show an example of an experimental result on breakdown voltage characteristics of a supporting member according to the first embodiment and its comparative example.
Figure 5B:
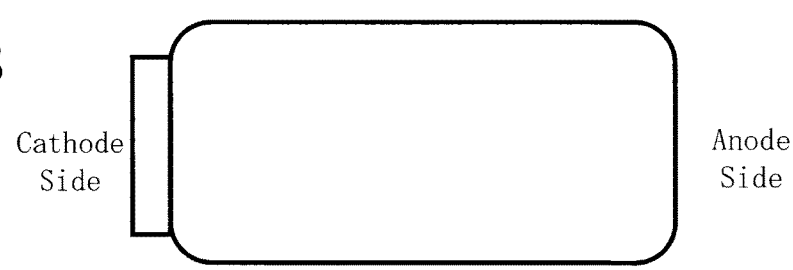
Figure 5C:
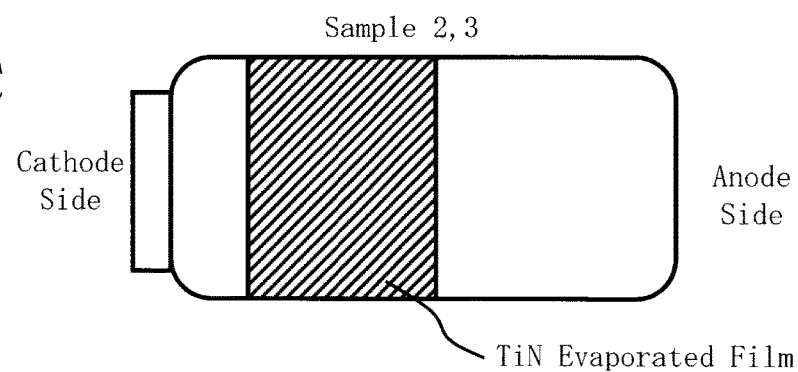

FIGS. 5A to 5C show an example of an experimental result on breakdown voltage characteristics of the supporting member according to the first embodiment and its comparative example. Fig. C shows the supporting member 300 according to the first embodiment. Here, two samples 2 and 3 according to the first embodiment are prepared. FIG. 5B shows a sample 1 being a comparative example of the supporting member 300 according to the first embodiment.

No metal film is formed on the sample 1, whereas the metal films 306 are formed on the samples 2 and 3. Measurement of the breakdown voltage is performed for the three samples 1, 2, and 13. The measurement is performed under three conditions for breakdown voltages of samples in a state newly fabricated, in a state after conditioning in vacuum and before exposing to the atmosphere, and in a state of vacuum evacuated again after once exposing to the atmosphere. As the conditioning, a voltage of 80 kV that is larger than that actually used is applied so that creeping discharge may occur, and then, the voltage application is continued for thirty minutes until the creeping discharge becomes large. Breakdown voltages have been measured under each condition. As a result, as shown in FIG. 5A, it turns out that the breakdown voltage increases by the conditioning. Moreover, it turns out that the breakdown voltages of the samples 2 and 3 on each of which the metal film 306 is formed according to the first embodiment are higher than that of the sample 1 where no metal film 306 is formed. Furthermore, it turns that the breakdown voltage greatly decreases (67% down), by being exposed to the atmosphere, in the sample 1 where no metal film 306 is formed, whereas the preferable state where breakdown voltages seldom decrease (1 to 3% down) can be maintained in the samples 2 and 3 on each of which the metal film 306 is formed according to the first embodiment. When a negative high potential is applied to the end of the main body 302 (insulating supporting member), at the Wehnelt electrode 56 connection side (cathode side), a secondary electron transmits through the outer surface toward the housing 50 connection side (anode side: ground side) of the main body 302 that has a ground potential. However, in the middle of the transmission on the outer surface, emission of secondary electrons is suppressed by the metal film 306 which is potentially floating and whose material has a secondary electron emission coefficient less than that of the main body 302 (insulating supporting member). Therefore, the transmission of the secondary electron towards the housing 50 connection side (anode side: ground side) can be suppressed. Consequently, the creeping discharge can be suppressed.

As described above, the breakdown voltage characteristics of the supporting member 300 can be improved by forming the metal film 306 to be a predetermined width (length) in a partial region, which contacts neither the Wehnelt electrode 56 (high-voltage electrode) nor the housing 50 (predetermined member), on the outer surface of the main body 302. Furthermore, the breakdown voltage decrease can also be inhibited even after being exposed to the atmosphere. Similarly, with respect to the supporting member 310, the breakdown voltage characteristics can be improved by forming the metal film 306 to be a predetermined width (length) in a partial region on the outer surface of the main body 302.

Thus, as described above, according to the first embodiment, it is possible to inhibit a creeping discharge in the supporting member of the high-voltage electrode. Therefore, change of the acceleration voltage of an electron beam can be suppressed, and further, change of the beam current can be suppressed. Accordingly, it is possible to inhibit degradation of the writing accuracy of pattern written.

Second Embodiment

Although, in the first embodiment, there has been described the case where a high voltage V is insulated between one end and the other end of the cylindrical supporting member, and the outer circumferential surface (curved surface) of the supporting member is a surface where a creeping discharge may occur, the insulation direction of the supporting member is not limited thereto. In the second embodiment, another case will be described. The structure of the writing apparatus 100 of the second embodiment is the same as that of FIG. 1. The contents of the second embodiment are the same as those of the first embodiment except what is described below.

Figure 6:
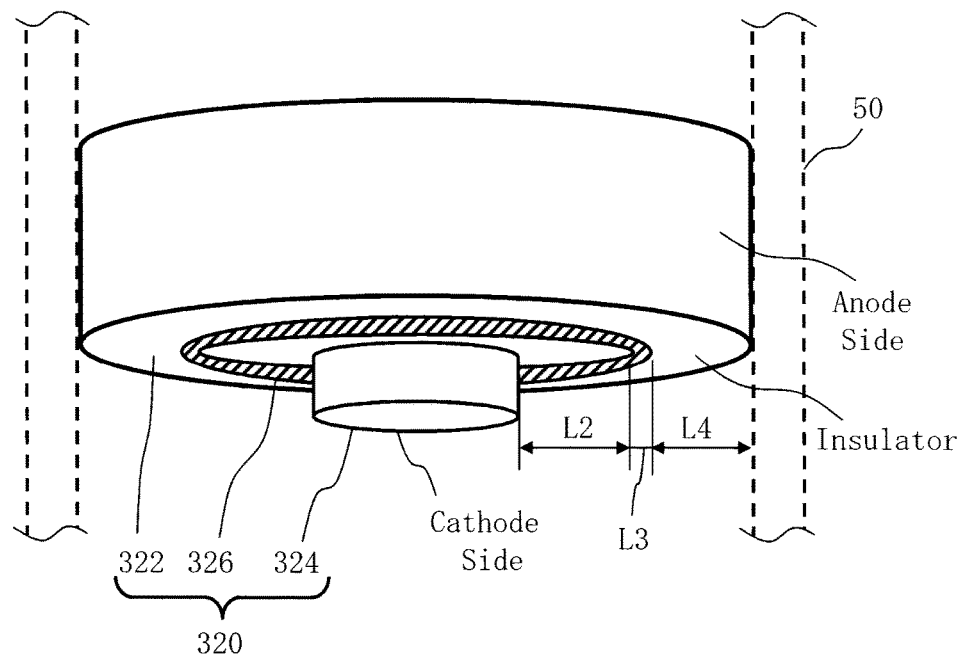
FIG. 6 shows the structure of a supporting member according to the second embodiment.

FIG. 6 shows the structure of a supporting member according to the second embodiment. As shown in FIG. 6, an attachment metal fitting 324 is arranged in the center of one end of a main body 322 of a supporting member 320. The main body 322 (insulating supporting member) is formed, for example, to be a solid flat cylindrical shape by using insulating material. For example, it is preferable to use alumina ($Al_2O_3$) (glass material). The attachment metal fitting 324 may be made of a conductive material (metal). According to the second embodiment, when supporting the Wehnelt electrode 56, the central part of one end of the main body 322 is connected to the Wehnelt electrode 56 through the attachment metal fitting 324, and the outer circumferential surface of the main body 322 is connected to the internal wall of the housing 50 having a ground potential. Instead of the supporting member 300 shown in FIG. 2, the supporting member 320 is arranged above the Wehnelt electrode 56, and supports the Wehnelt electrode 56 by connecting the upper surface of the Wehnelt electrode 56 and the attachment metal fitting 324.

Therefore, with respect to the supporting member 320 according to the second embodiment, it becomes a cathode (negative electrode) by connecting the central part of the plane at one end of the main body 322 and the Wehnelt electrode 56, and electrons become movable radially toward the outer circumferential surface through the plane at the one end of the main body 322. In other words, a creeping discharge may occur between the center and the peripheral circle on the plane at one end of the main body 322. That is, according to the second embodiment, the plane at one end of the cylindrical main body 322 is a surface where a creeping discharge may occur.

Then, according to the second embodiment, a metal film 326 is formed in a partial region, which contacts neither the Wehnelt electrode 56 (high-voltage electrode) nor the housing 50 (predetermined member), on the circular plane at one end of the main body 322 being the outer surface of the main body 322 where a creeping discharge may occur. In the case of FIG. 6, L1 is the length of the main body 322 from the peripheral edge of the attachment metal fitting 324 toward the outside in the radial direction, L2 is the distance from the peripheral edge of the attachment metal fitting 324 at the Wehnelt electrode 56 connection side (cathode side) to the position from which the metal film 326 is formed, and L3 is the width of the circular region where the metal film 326 is formed. That is, the width (length) L2 from the peripheral edge of the attachment metal fitting 324 at the Wehnelt electrode 56 connection side (cathode side) of the main body 322 toward the outside in the radial direction is an insulation distance (creeping distance) where no metal film 326 is formed. Moreover, the width (length) L4 from the peripheral edge of the main body 322, at the housing 50 connection side (anode side: ground side) toward the inside in the radial direction is also an insulation distance (creeping distance) where no metal film 306 is formed. As described above, the metal film 326 is made from a material whose secondary electron emission coefficient is less than that of the main body 322 (insulating supporting member). For example, TiN, $Mo_2C$, or the like is preferably used. The values from L2 to L4 with respect to the plane at one end of the main body 322 can be obtained by calculation similarly to the first embodiment.

As described above, according to the second embodiment, even in the case where a creeping discharge may occur between the center and the peripheral circle on the plane at one end of the supporting member 320, it is possible to suppress the creeping discharge in the supporting member of a high-voltage electrode by forming the circular metal film 326 on the plane.

Third Embodiment

Although, in the first embodiment, the case where the metal film 306 is formed in one partial region of the outer circumferential surface of the main body 302 has been described, it is not limited thereto. In the third embodiment, a case where the metal film 306 is formed in a plurality of regions on the outer circumferential surface of the main body 302 will be described. The structure of the writing apparatus 100 of the third embodiment is the same as that of FIG. 1. The contents of the second embodiment are the same as those of the first embodiment except what is described below.

Figure 7:
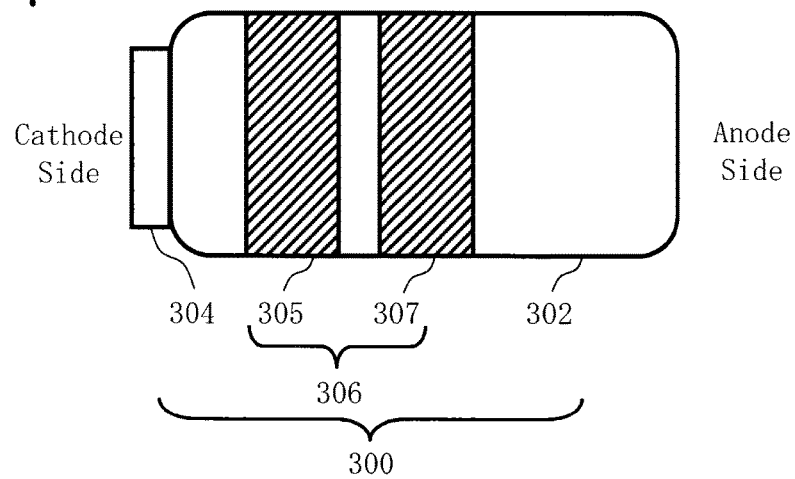
FIG. 7 shows the structure of a supporting member according to the third embodiment.

FIG. 7 shows the structure of a supporting member according to the third embodiment. FIG. 7 shows the supporting member 300 as an example. As shown in FIG. 7, in the supporting member 300, the metal films 306 may be separately formed in a plurality of metal films 305 and 307 which do not contact each other. The total of the widths of a plurality of metal films 305 and 307 should be L3 having been explained in the first embodiment.

As described above, according to the third embodiment, even when the metal film 306 is composed of a plurality of metal films 305 and 307, the creeping discharge in the supporting member of a high-voltage electrode can be suppressed.

Fourth Embodiment

Although, in the first embodiment, there has been described the case where the position at which the metal film 306 is formed is not particularly specified as long as the relation among L1 to L4 is satisfied, the case of particularly specifying the position will be described in the fourth embodiment. The structure of the writing apparatus 100 of the fourth embodiment is the same as that of FIG. 1. The contents of the fourth embodiment are the same as those of the first embodiment except what is described below.

Figure 8:
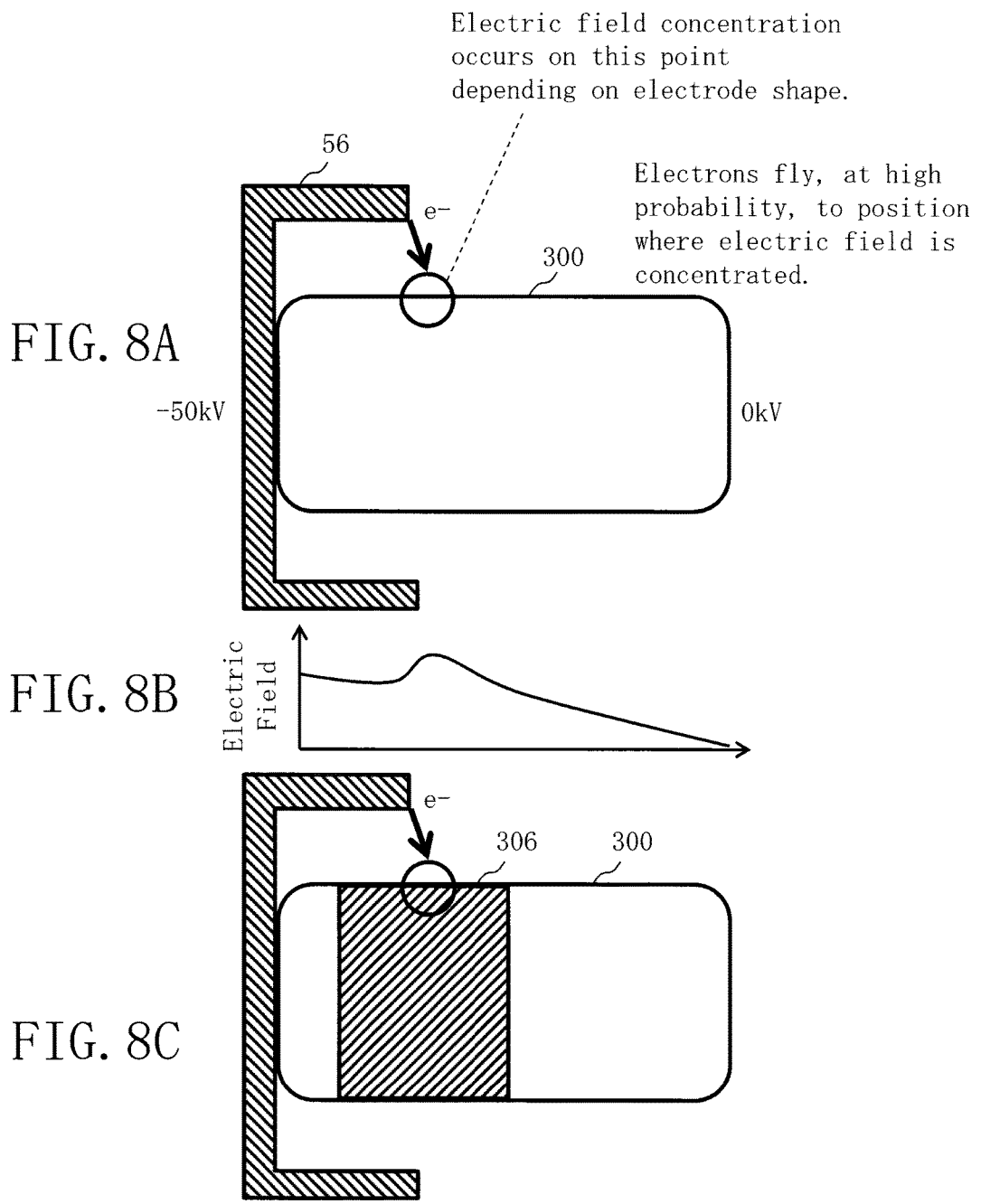
FIGS. 8A to 8C illustrate a metal film formation position of a supporting member according to the fourth embodiment.
Figure 9:
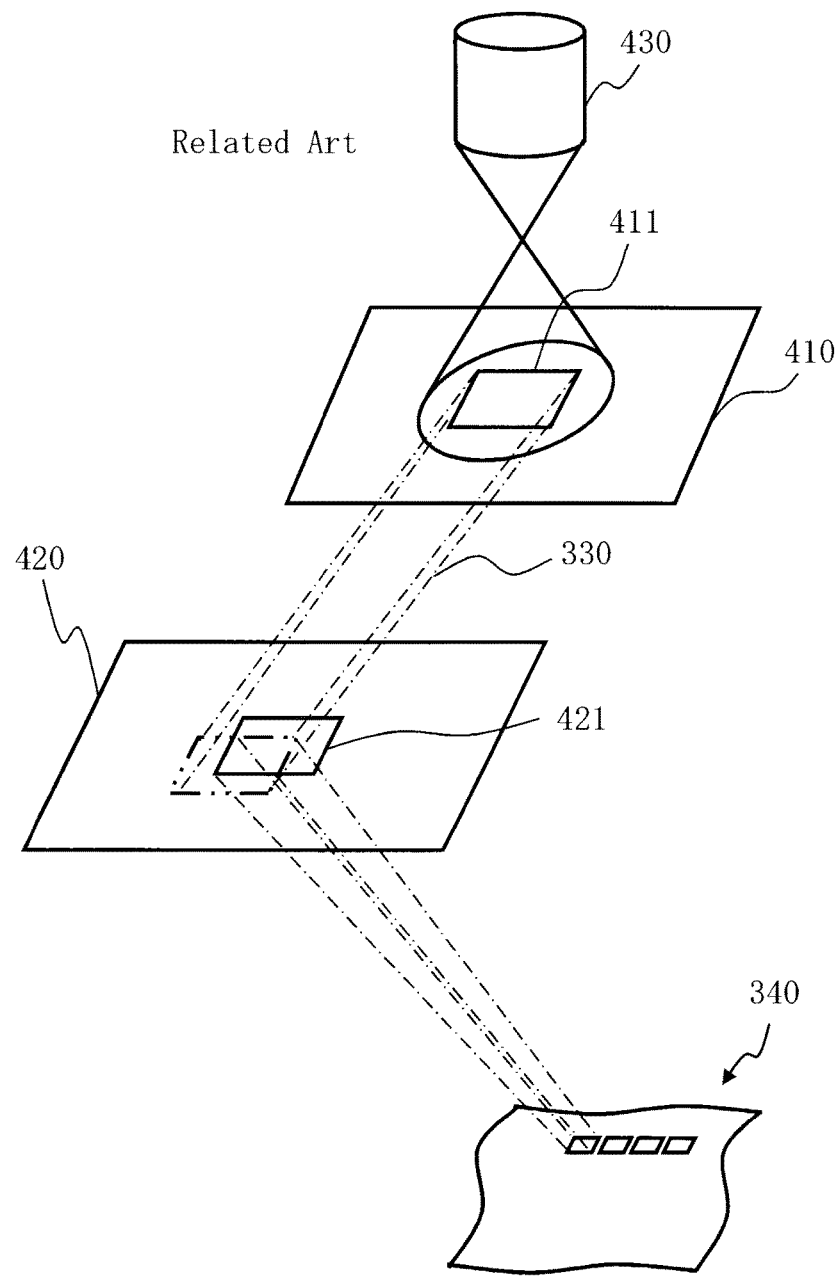
FIG. 9 is a conceptual diagram explaining operations of a variable shaped electron beam writing apparatus.

FIGS. 8A to 8C illustrate the metal film formation position of a supporting member according to the fourth embodiment. If a negative high potential is applied to the Wehnelt electrode 56, a case may occur where, depending on the shape of the Wehnelt electrode 56, the electric field is concentrated on a certain portion on the insulator surface of the main body of the supporting member. If there is a portion where the electric field is concentrated, electrons are easy to fly to the portion. For example, in the case of the shape of the Wehnelt electrode 56 shown in FIG. 8A, electric field concentration occurs on the edge of the Wehnelt electrode. Consequently, a portion where an electric field becomes strong may be generated on the insulator surface. In the case of the shape of the Wehnelt electrode 56 shown in FIG. 8A, as shown in FIG. 8B, electric field concentration occurs at the position a little away from the cathode side, with respect to the surface of the object closest to the end of the Wehnelt electrode 56. According to the fourth embodiment, as shown in FIG. 8C, the metal film 306 is arranged at the electric field concentration position close to the end of the Wehnelt electrode 56. In the case of the electrode as shown in FIG. 8A, a portion where an electric field becomes strong is generated on the insulator, depending upon the shape of the electrode. Since electrons are easy to collect at the position where an electric field is strong, such a position should be selected for arranging the metal film 306. Thereby, even when an electron flies from the end of the Wehnelt electrode 56, secondary electron emission can be suppressed by the metal film 306. Consequently, the amount of secondary electron emission is reduced, and a creeping discharge can be further suppressed.

Referring to specific examples, embodiments have been described above. However, the present invention is not limited to these examples. The electron beam apparatus in which the selected cathode is mounted is not limited to a writing apparatus, and the selected cathode can also be applied to other electron beam apparatus such as an electron microscope. As for the material used for the cathode, while the case of using single crystal lanthanum hexaboride ($LaB_6$) has been explained as an example, it is also acceptable to use other thermionic emitting material such as single crystal tungsten (W), single crystal cerium hexaboride ($CeB_6$), etc. Moreover, with respect to the electron emission surface of the cathode 10, the region of the electron emission surface is preferably limited by a carbon film, but not limited thereto. Other material, such as rhenium (Re), having a work function higher than that of electron emission material may also be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other electron gun supporting member, electron gun apparatus, electron beam writing apparatus, and electron beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron gun supporting member comprising:
   an insulating supporting member having one end connected to a predetermined member having a ground potential and other end is connected to a high-voltage electrode to which a high potential being a negative high potential for emitting electrons from an electron source is applied, so as to support the high-voltage electrode; and
   a metal film formed in a partial region, which contacts neither the high-voltage electrode nor the predetermined member, on an outer surface of the insulating supporting member.

2. The member according to claim 1, wherein the metal film is formed on the outer surface of the insulating supporting member such that a resistance in a region where the metal film is not formed is a resistance through which a current that may flow between the high potential and the ground potential is less than or equal to an allowable dark current.

3. The member according to claim 1, wherein a material whose secondary electron emission coefficient is less than that of the insulating supporting member is used as a material of the metal film.

4. The member according to claim 1, wherein the insulating supporting member is formed to be a solid cylindrical shape by using insulating material.

5. The member according to claim 4, wherein a glass material is used as a material of the insulating material for the insulating supporting member.

6. The member according to claim 5, wherein a titanium compound is used as a material of the metal film.

7. The member according to claim 5, wherein a molybdenum compound is used as a material of the metal film.

8. The member according to claim 1, wherein the metal film is formed at the position away, in units of mm, from the other end of the insulating supporting member.

9. An electron gun apparatus comprising:
a cathode that emits electrons in a case of being applied with an acceleration voltage;
a Wehnelt electrode to be applied with a potential more negative than a negative potential of the acceleration voltage;
an insulating supporting member having one end connected to a predetermined member having a ground potential and other end connected to the Wehnelt electrode so as to support the Wehnelt electrode; and
a metal film formed in a partial region, which contacts neither the Wehnelt electrode nor the predetermined member, on an outer surface of the insulating supporting member.

10. The apparatus according to claim 9, wherein an end of the insulating supporting member is applied with a voltage, which is more negative than the acceleration voltage, by contacting the Wehnelt electrode.

11. The apparatus according to claim 9, wherein a material whose secondary electron emission coefficient is less than that of the insulating supporting member is used as a material of the metal film.

12. An electron gun supporting member comprising:
a line connected to a high-voltage electrode;
an insulating supporting member having one end connected to a predetermined member having a ground potential and other end that supports the line connected to the high-voltage electrode to which a negative high potential for emitting electrons from an electron source is applied; and
a metal film formed in a partial region, which contacts neither the line nor the predetermined member, on an outer surface of the insulating supporting member.

13. The member according to claim 12, wherein a material whose secondary electron emission coefficient is less than that of the insulating supporting member is used as a material of the metal film.

* * * * *